(12) United States Patent
Umemoto

(10) Patent No.: US 10,281,969 B2
(45) Date of Patent: May 7, 2019

(54) SEMICONDUCTOR PACKAGE

(71) Applicant: Rohm Co., Ltd., Kyoto (JP)

(72) Inventor: Kiyotaka Umemoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/687,698

(22) Filed: Aug. 28, 2017

(65) Prior Publication Data

US 2018/0059759 A1    Mar. 1, 2018

(30) Foreign Application Priority Data

Aug. 29, 2016 (JP) ................................. 2016-166487
Aug. 29, 2016 (JP) ................................. 2016-166488
Jun. 22, 2017 (JP) ................................. 2017-122392

(51) Int. Cl.
*G06F 1/28* (2006.01)
*G06F 1/26* (2006.01)
(Continued)

(52) U.S. Cl.
CPC .................. *G06F 1/28* (2013.01); *G06F 1/26* (2013.01); *G06F 12/0284* (2013.01); *H01L 22/34* (2013.01); *H01L 23/3114* (2013.01); *H01L 23/34* (2013.01); *H01L 23/4952* (2013.01); *H01L 23/49575* (2013.01); *H01L 24/45* (2013.01); *H01L 24/48* (2013.01); *H01L 43/06* (2013.01); *G05B 15/02* (2013.01); *G05B 2219/2208* (2013.01); *G06F 12/0646* (2013.01); *G06F 13/10* (2013.01); *G06F 2212/1048* (2013.01); *H01L 25/10* (2013.01);
(Continued)

(58) Field of Classification Search
CPC ........... H01L 23/3114; H01L 23/49575; H01L 22/34; H01L 23/34; H01L 23/4952; H01L 24/45; H01L 24/48; H01L 43/06; H01L 25/10; H01L 2224/48245; H01L 2224/45144; G06F 1/28; G06F 1/206; G06F 12/0284; G06F 13/10; G06F 12/06; G05B 2219/2208; G05B 15/02
See application file for complete search history.

(56) References Cited

U.S. PATENT DOCUMENTS 6,438,462 B1 * 8/2002 Hanf ..................... G06F 1/3203
340/693.4
8,819,606 B1   8/2014 Ashraf
(Continued)

FOREIGN PATENT DOCUMENTS

| | | |
|---|---|---|
| JP | 2000-088680 | 3/2000 |
| JP | 2007-257028 | 10/2007 |
| WO | 2014/084150 | 6/2014 |

OTHER PUBLICATIONS

European Patent Office, Partial European Search Report for EP Application No. 17188061.0 (dated Jan. 31, 2018).

*Primary Examiner* — Victor A Mandala
(74) *Attorney, Agent, or Firm* — Fish & Richardson P.C.

(57) ABSTRACT

A semiconductor package includes a plurality of chips, which include a plurality of corresponding functional blocks having the same function among the chips, and only one of the corresponding functional blocks having the same function among the chips enables function, and one or more functional blocks enable function in each of the chips, so that the functional blocks are distributed among the chips.

10 Claims, 15 Drawing Sheets

(51) Int. Cl.
- *H01L 23/00* (2006.01)
- *H01L 23/31* (2006.01)
- *H01L 23/34* (2006.01)
- *H01L 43/06* (2006.01)
- *H01L 23/495* (2006.01)
- *G06F 12/02* (2006.01)
- *H01L 21/66* (2006.01)
- *G05B 15/02* (2006.01)
- *G06F 12/06* (2006.01)
- *G06F 13/10* (2006.01)
- *H01L 25/10* (2006.01)

(52) U.S. Cl.
CPC ............... *H01L 2224/45144* (2013.01); *H01L 2224/48245* (2013.01)

(56) References Cited

U.S. PATENT DOCUMENTS

| | | |
|---|---|---|
| 2006/0289862 A1 | 12/2006 | Yoshida et al. |
| 2007/0101194 A1* | 5/2007 | Lockwood .......... G06F 11/2236 714/30 |
| 2007/0220195 A1 | 9/2007 | Kawaguchi |
| 2008/0278115 A1* | 11/2008 | Huggins .................. B60L 3/12 320/134 |
| 2010/0052826 A1* | 3/2010 | Callahan ............... H01L 23/642 333/24 R |
| 2010/0073068 A1 | 3/2010 | Cho et al. |
| 2014/0380016 A1 | 12/2014 | Matsunaga |
| 2015/0187209 A1* | 7/2015 | Brandt ................... G08C 19/00 340/12.22 |

* cited by examiner

SEMICONDUCTOR PACKAGE

CROSS-REFERENCE TO RELATED APPLICATIONS

This nonprovisional application claims priority under 35 U.S.C. § 119(a) on Patent Applications No. 2016-166487 filed in Japan on Aug. 29, 2016, No. 2016-166488 filed in Japan on Aug. 29, 2016, and No. 2017-122392 filed in Japan on Jun. 22, 2017, the entire contents of which are hereby incorporated by reference.

BACKGROUND OF THE INVENTION

Field of the Invention

The present invention relates to a semiconductor package.

Description of Related Art

Conventionally, semiconductor packages are developed for use as a microcomputer, a power supply device, and the like, and the semiconductor packages are mounted in various devices.

Note that examples of conventional techniques related to the above description are disclosed in JP-A-2007-257028 and JP-A-2000-88680.

The semiconductor package described above may be constituted for in-vehicle use in particular these days. For example, a semiconductor package as a microcomputer may be incorporated in an electronic control unit (ECU) mounted in a vehicle.

In the vehicle related field, ISO26262 or the like as an international standard for electric/electronic functional safety of a vehicle is laid down, and in this situation, in order to attach more importance to safety, it is particularly required to achieve longer life of semiconductor packages mounted in vehicles.

In addition, along with widespread use of electric vehicle (EV) and the like, a power supply system that supplies power to a vehicle in a noncontact manner is developed recently. When supplying power with this power supply system, a strong magnetic field is generated, and hence a microcomputer mounted in the stopped vehicle may cause a malfunction. This malfunction may cause the vehicle to erroneously start to drive or to erroneously unlock a door.

In the vehicle related field, ISO26262 or the like as an international standard for electric/electronic functional safety of a vehicle is laid down, and hence more safety is required as the situation.

SUMMARY OF THE INVENTION

In view of the situation described above, it is a first object of the present invention to provide a semiconductor package capable of achieving a longer life. In addition, it is a second object of the present invention to provide a semiconductor package capable of preventing an electronic device from having a malfunction by influence of a magnetic field.

A semiconductor device according to one aspect of the present invention includes a plurality of chips. The plurality of chips include a plurality of corresponding functional blocks having the same function among the chips. Only one of the corresponding functional blocks having the same function among the chips enables function, and one or more functional blocks enable function in each of the chips so that the functional blocks are distributed among the chips.

A semiconductor device according to another aspect of the present invention includes one or more functional blocks, a magnetic field detecting unit arranged to detect a magnetic field, and a protection unit arranged to protect at least one of the functional blocks when the magnetic field detecting unit detects a magnetic field.

DETAILED DESCRIPTION OF THE PREFERRED EMBODIMENTS

Hereinafter, embodiments of the present invention are described with reference to the drawings.

<First Embodiment>

Figure 1:
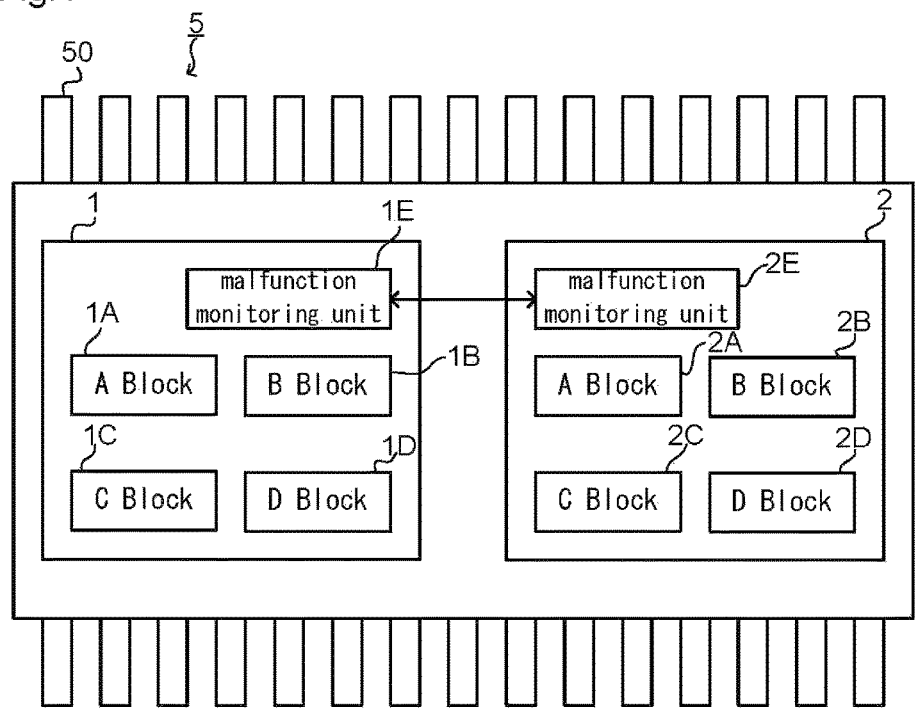
FIG. 1 is a block diagram illustrating a schematic structure of a semiconductor package according to a first embodiment of the present invention.

FIG. 1 is a block diagram illustrating a schematic structure of a semiconductor package according to a first embodiment of the present invention. A semiconductor package 5 according to the first embodiment illustrated in FIG. 1 includes two chips (IC chips), i.e. a first chip 1 and a second chip 2, and is constituted as a multichip semiconductor package.

In addition, the semiconductor package 5 has various lead frames (pins) 50. The first chip 1 and the second chip 2 are fixed to the lead frames 50. Electrodes of the first chip 1 and the second chip 2 are connected to the lead frames 50 with not-shown bonding wires (such as Au wires). The first chip 1, the second chip 2, and the lead frames 50 are sealed with resin. The lead frames 50 are connected to wirings of a not-shown printed circuit board so that the semiconductor package 5 is mounted on the printed circuit board. In this way, the first chip 1 and the second chip 2 can communicate electrical signals and powers with the printed circuit board.

The first chip 1 includes a first A block 1A, a first B block 1B, a first C block 1C, a first D block 1D, and a malfunction monitoring unit 1E. The second chip 2 includes a second A block 2A, a second B block 2B, a second C block 2C, a second D block 2D, and a malfunction monitoring unit 2E. The malfunction monitoring unit 1E and the malfunction monitoring unit 2E can communicate with each other.

The first A block 1 A and the second A block 2A are functional blocks having the same function. In the same manner, the first B block 1B and the second B block 2B are functional blocks having the same function, the first C block 1C and the second C block 2C are functional blocks having the same function, and the first D block 1D and the second D block 2D are functional blocks having the same function.

«Longer Life Support»

In this embodiment, only one of corresponding function blocks having the same function (e.g. the first A block 1A and the second A block 2A) between the first chip 1 and the second chip 2 enables function, and one or more functional blocks enable function in each of the first chip 1 and the second chip 2.

In this way, a predetermined function is realized as the entire semiconductor package 5, and heat generated in the functional blocks by enabling function can be distributed to different chips, and hence life of the semiconductor package 5 can be elongated. In this case, it is preferred to decrease a difference between average temperature due to heat generated by the functional block enabling function in the first chip 1 and average temperature due to heat generated by the functional block enabling function in the second chip 2, as much as possible.

Figure 2:
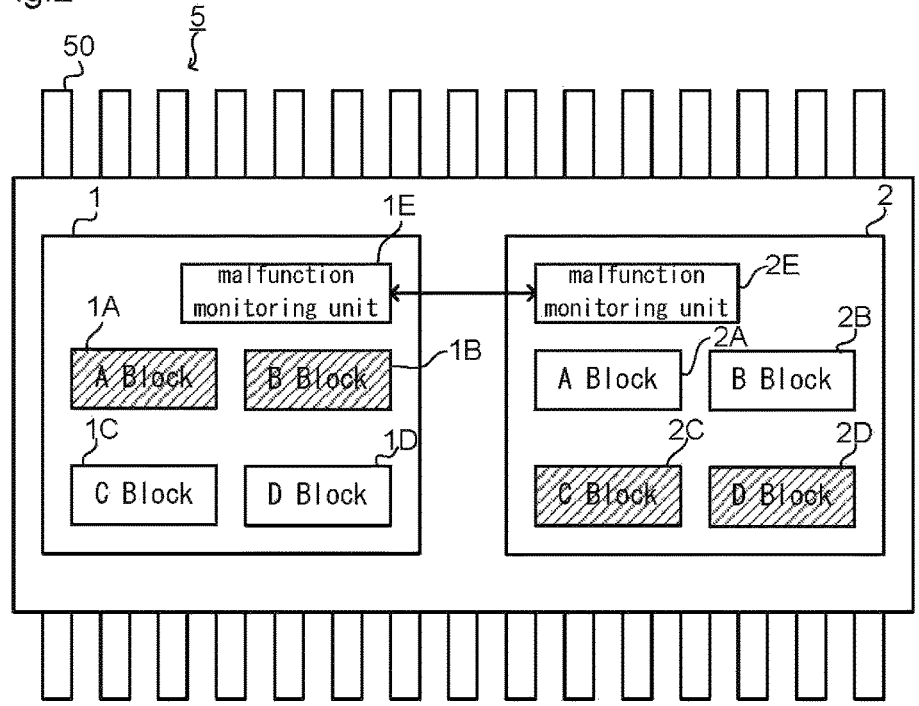
FIG. 2 is a diagram illustrating an example of distribution of functional blocks in the semiconductor package according to the first embodiment of the present invention.

For example, in the example illustrated in FIG. 2, the first chip 1 and the second chip 2 respectively include the first A block 1A and the second A block 2A, which are corresponding functional blocks having the same function, and only the first A block 1A enables function (operates) while the second A block 2A disables function (stops operation). In the same manner, only the first B block 1B enables function between the first B block 1B and the second B block 2B, only the second C block 2C enables function between the first C block 1C and the second C block 2C, and only the second D block 2D enables function between the first D block 1D and the second D block 2D. In addition, two functional blocks enable function in the first chip 1, and two functional blocks enable function in the second chip 2.

In this case, it is supposed that temperatures of the first A block 1A and the first B block 1B due to heat generation are 70 degrees Celsius and 40 degrees Celsius, respectively, and that temperatures of the second C block 2C and the second D block 2D due to heat generation are 50 degrees Celsius and 60 degrees Celsius, respectively, for example. Then, average temperatures in the first chip 1 and the second chip 2 are both 55 degrees Celsius, and there is no difference between the average temperatures, which is advantageous for longer life of the semiconductor package 5.

«Operation When Malfunction is Detected»

In addition, in this embodiment, in a normal operation, the malfunction monitoring unit 1E monitors whether or not the functional block that enables function in the first chip 1 has a malfunction, and the malfunction monitoring unit 2E monitors whether or not the functional block that enables function in the second chip 2 has a malfunction. Then, if one of the malfunction monitoring unit 1E and the malfunction monitoring unit 2E detects a malfunction of the functional block, the malfunction monitoring unit that has detected the malfunction sends notification to the other malfunction monitoring unit. In this way, the malfunction monitoring unit that receives the notification enables all functional blocks of the chip on this malfunction monitoring unit side (i.e. the normal chip). On the other hand, the malfunction monitoring unit that has detected a malfunction disables all functions of the chip on this malfunction monitoring unit side.

In this way, between the first chip 1 and the second chip 2, the chip in which a malfunction is detected disables function, and the other normal chip can continue to operate a predetermined function as the entire semiconductor package 3.

Figure 3:
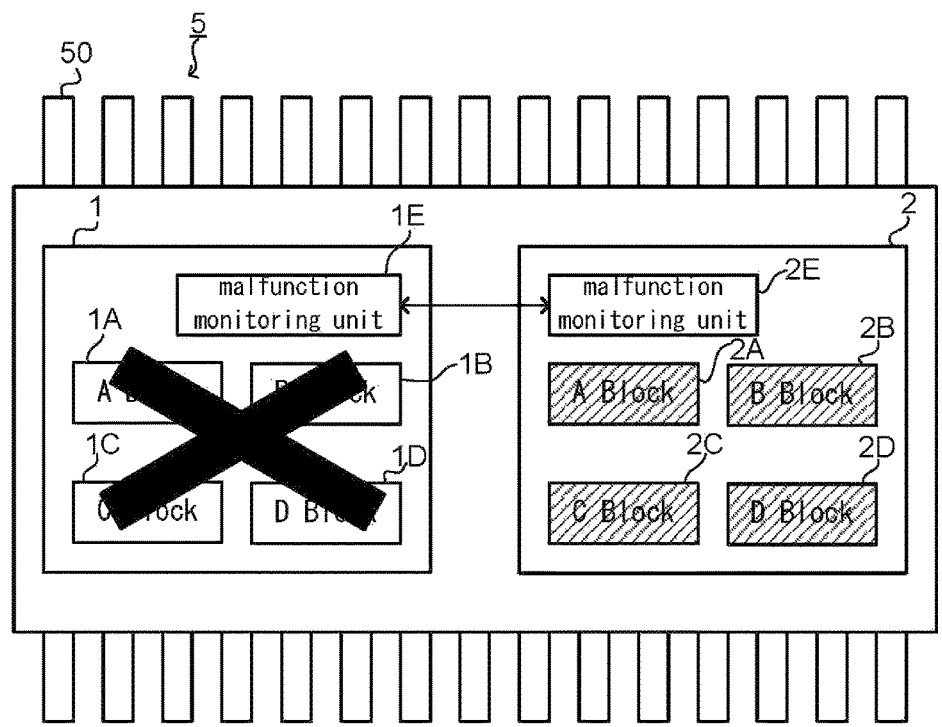
FIG. 3 is a diagram illustrating an example of a case where a malfunction of a chip occurs in the semiconductor package according to the first embodiment of the present invention.

For example, in the example illustrated in FIG. 3, there is described a case where the malfunction monitoring unit 1E detects a malfunction in one of the first A block 1A and the first B block 1B that enable function in the first chip 1 as described above with reference to FIG. 2, and the malfunction monitoring unit 1E sends notification to the malfunction monitoring unit 2E. In this case, the malfunction monitoring unit 2E that received the notification enables all functional blocks of the second chip 2 (the second A block 2A to the second D block 2D), while the malfunction monitoring unit 1E disables all functional blocks of the first chip 1.

«Variations»

As described above, in this embodiment, the functional blocks that enable function are distributed between the first chip 1 and the second chip 2. However, instead of always enabling only the fixed functional block, it is possible to change the functional block to be enabled while the functional blocks to be enabled may be distributed between the chips. In this way, the structure becomes more advantageous for longer life.

Figure 4:
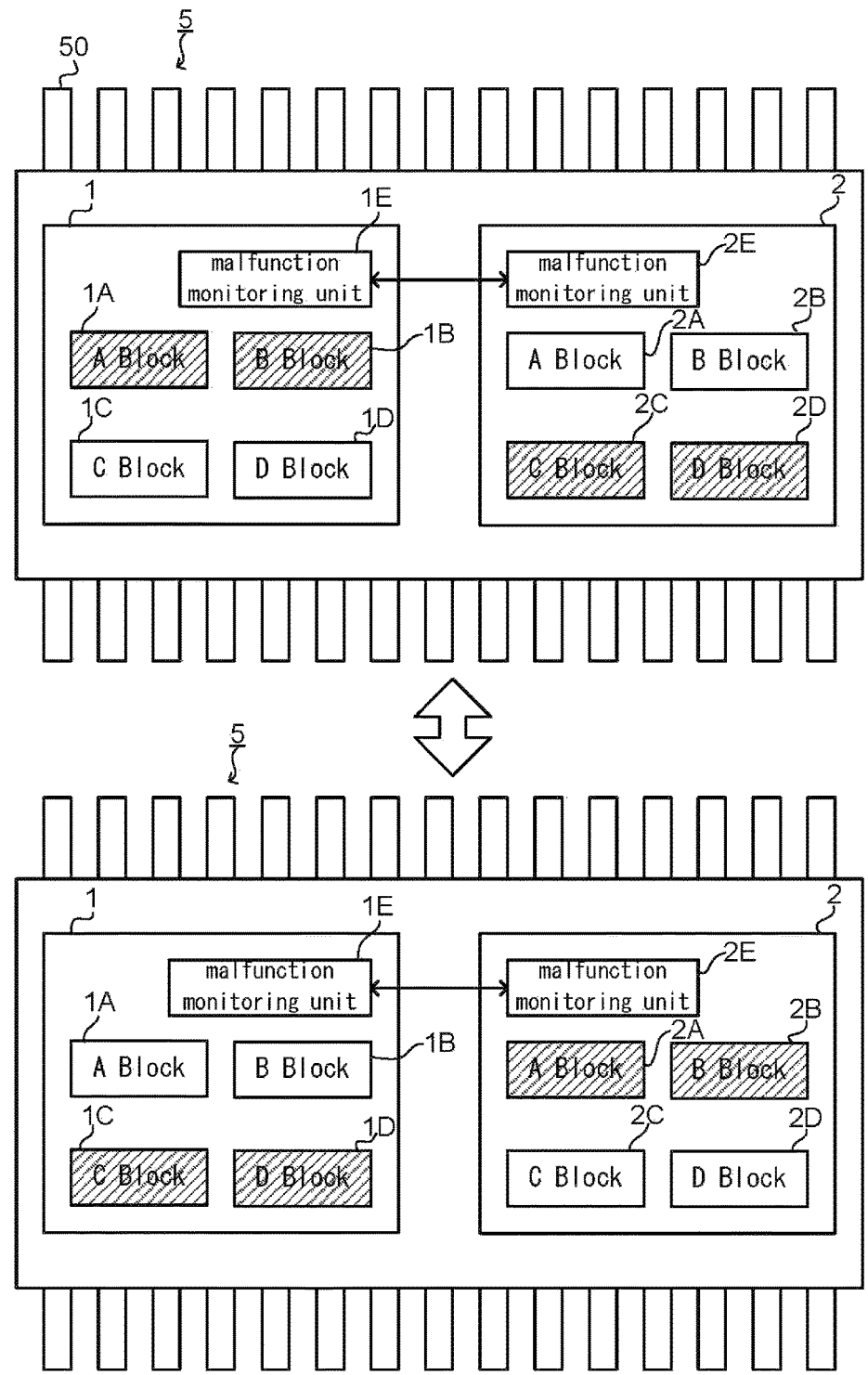
FIG. 4 is a diagram illustrating an example where the functional blocks are changed and distributed in the semiconductor package according to the first embodiment of the present invention.

For example, in the example illustrated in FIG. 4, the upper part shows a state where the first A block 1A and the first B block 1B enable function in the first chip 1, while the second C block 2C and the second D block 2D enable function in the second chip 2. Then, as shown in the lower part, from the state described above, the functional blocks to be enabled in the first chip 1 are changed to the first C block 1C and the first D block 1D, and the functional blocks to be enabled in the second chip 2 are changed to the second A block 2A and the second B block 2B. These states illustrated in the upper part and the lower part of FIG. 4 are sequentially repeated. Note that switching of the states may be performed, for example, every time when the number of start-up times of the semiconductor package 5 reaches a predetermined number.

In addition, depending on the operation mode of the semiconductor package 5, a heated state of the functional block may be changed. Therefore, it is possible to change the functional block to enable function depending on the operation mode so that the functional blocks to be enabled are distributed between the chips. In this way, depending on the heated state due to the operation mode, appropriate functional blocks can be distributed, and hence the longer life effect can be increased.

For example, it is supposed that in an certain operation mode, the A block and the B block enable function and have temperatures of 70 degrees Celsius and 40 degrees Celsius, respectively, while the C block and the D block enable function and have temperatures of 50 degrees Celsius and 60 degrees Celsius, respectively. Then, it is supposed that in this operation mode, as illustrated in FIG. 2, the first A block 1A and the first B block 1B enable function in the first chip 1, while the second C block 2C and the second D block 2D enable function in the second chip 2, and the functional blocks are distributed so that average temperatures of the chips are the same 55 degrees Celsius.

In this case, it is supposed that in another operation mode, the A block and the B block enable function and have temperatures of 70 degrees Celsius and 80 degrees Celsius, respectively, while the C block and the D block enable function and have temperatures of 50 degrees Celsius and 60 degrees Celsius. Therefore, in this another operation mode, it is possible that the first A block 1A and the first D block 1D enable function in the first chip 1, while the second B block 2B and the second C block 2C enable function in the second chip 2, and the functional blocks are distributed so that average temperatures in the chips are the same 65 degrees Celsius.

Note that in the example described above, the functional blocks are distributed so that two functional blocks are enabled in each of the first chip 1 and the second chip 2, but the numbers of the distributed functional blocks is not limited to the same number. For example, it is possible to distribute to one and three.

<Second Embodiment>

Figure 5:
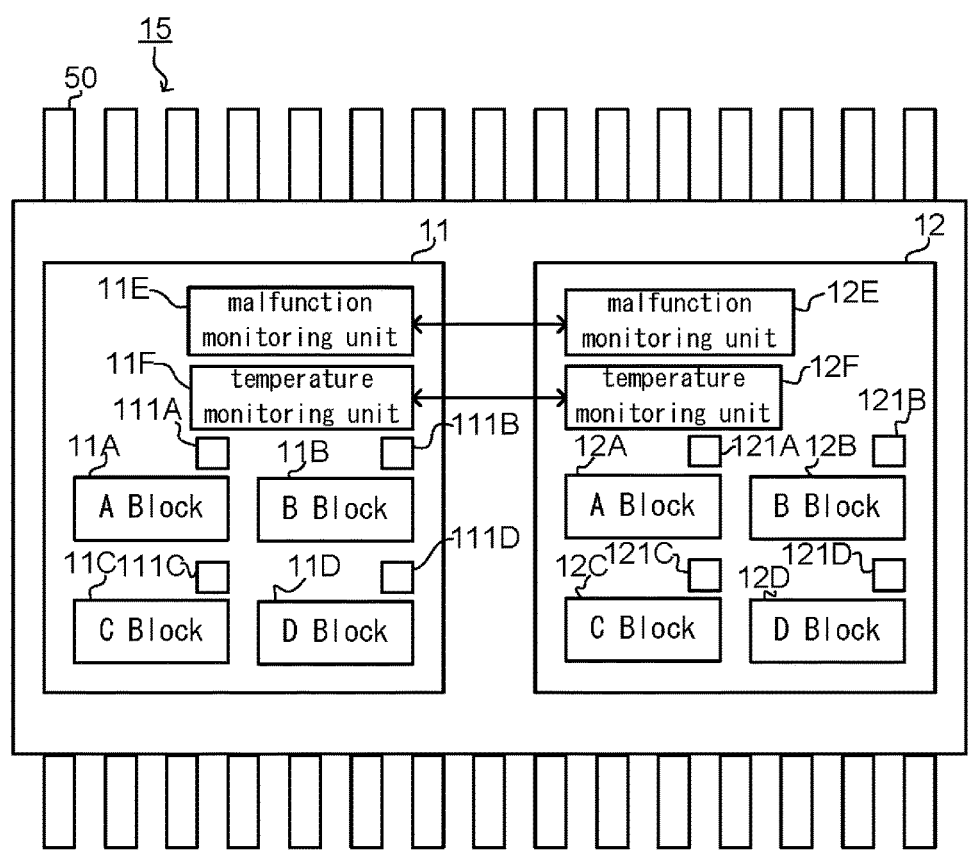
FIG. 5 is a block diagram illustrating a schematic structure of a semiconductor package according to a second embodiment of the present invention.

Next, a second embodiment of the present invention is described. FIG. 5 is a block diagram illustrating a schematic structure of a semiconductor package according to the second embodiment. A semiconductor package 15 according to the second embodiment illustrated in FIG. 5 includes a first chip 11 and a second chip 12.

The first chip 11 includes a first A block 11A, a first B block 11B, a first C block 11C, a first D block 11D, a malfunction monitoring unit 11E, a temperature monitoring unit 11F, and temperature detecting units 111A to 111D.

The second chip 12 includes a second A block 12A, a second B block 12B, a second C block 12C, a second D block 12D, a malfunction monitoring unit 12E, a temperature monitoring unit 12F, and temperature detecting units 121A to 121D.

The functional blocks (A block to D block) and the malfunction monitoring units in the first chip 11 and the second chip 12 are the same as in the first embodiment described above. The temperature detecting units 111A to 111D are sensors arranged to detect temperatures of the first A block 11A to the first D block 11D, respectively. The temperature monitoring unit 11F monitors temperatures of the first A block 11A to the first D block 11D based on detection signals output from the temperature detecting units 111A to 111D.

The temperature detecting units 121A to 121D are sensors arranged to detect temperatures of the second A block 12A to the second D block 12D, respectively. The temperature monitoring unit 12F monitors temperatures of the second A block 12A to the second D block 12D based on detection signals output from the temperature detecting units 121A to 121D.

One of the temperature monitoring unit 11F and the temperature monitoring unit 12F sends notification of the temperature monitor result to the other temperature monitoring unit via communication. In this way, the temperature monitoring unit that receives the notification is provided with temperature information of the functional blocks of both the first chip 1 and the second chip 2. This temperature monitoring unit determines functional blocks to enable function in the chip of itself and in the other chip based on the provided temperature information. Further, the temperature monitoring unit instructs to enable the determined functional blocks in the chip of itself and instructs to enable the functional blocks determined by the other temperature monitoring unit. In this way, the functional blocks are appropriately distributed between the first chip 11 and the second chip 12.

Figure 6:
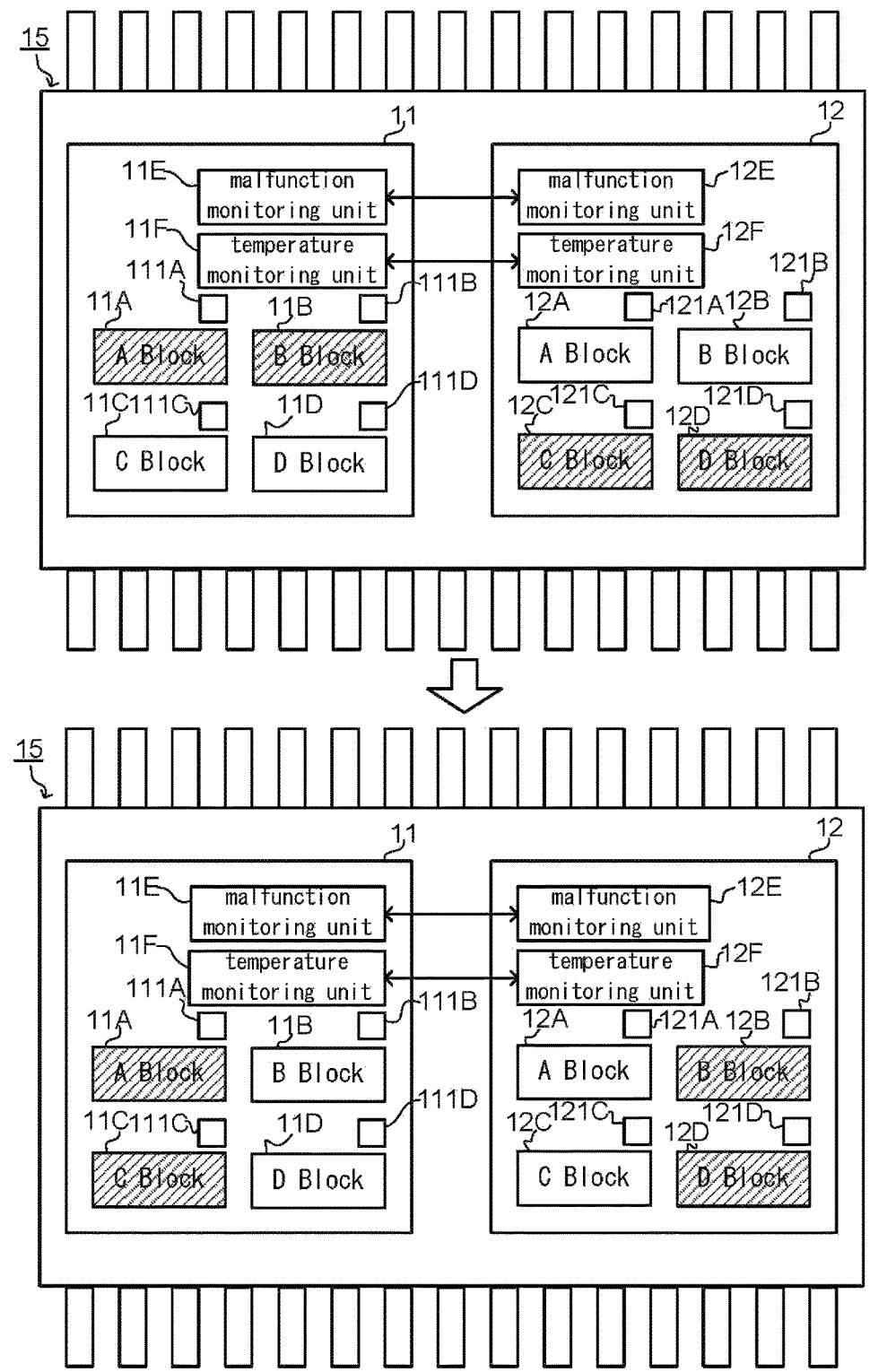
FIG. 6 is a diagram illustrating an example where the functional blocks are changed and distributed in the semiconductor package according to the second embodiment of the present invention.

For example, in the example illustrated in FIG. 6, the upper part shows a state where the first A block 11A and the first B block 11B enable function in the first chip 11, while the second C block 12C and the second D block 12D enable function in the second chip 12. In this case, the first A block 11A and the first B block 11B have temperatures of 70 degrees Celsius and 40 degrees Celsius, respectively, while the second C block 12C and the second D block 12D have temperatures of 60 degrees Celsius and 50 degrees Celsius, respectively. Thus, average temperatures of the chips are the same 55 degrees Celsius.

After that, it is supposed that the heated state is changed, and the temperature of the first B block 11B that enables function is increased up to 80 degrees Celsius. Then, the temperature monitoring unit 11F that monitors the temperatures of the first A block 11A and the first B block 11B sends notification of the temperature monitor result to the temperature monitoring unit 12F. The temperature monitoring unit 12F obtains temperature information of the second C block 12C and the second D block 12D monitored by itself, as well as temperature information of the first A block 11A and the first B block 11B.

In this case, temperatures of the first A block 11A and the first B block 11B are 70 degrees Celsius and 80 degrees Celsius, respectively, while temperatures of the second C block 12C and the second D block 12D are 60 degrees Celsius and 50 degrees Celsius, respectively. Therefore, the temperature monitoring unit 12F determines to make the first A block 11A and the first C block 11C enable function in the first chip 11 and to make the second B block 12B and the second D block 12D enable function in the second chip 12, so that average temperatures becomes the same between the chips (the average temperatures becomes the same 65 degrees Celsius). On the basis of this determination, as shown in the lower part of FIG. 6, the functional blocks to enable function are distributed between the first chip 11 and the second chip 12.

With this embodiment, for example, not only according to different operation modes but also in a case where the heated state is changed in the same operation mode, the functional blocks are appropriately distributed between the chips, and hence the longer life effect of the semiconductor package 15 can be increased.

<Third Embodiment>

Figure 7:
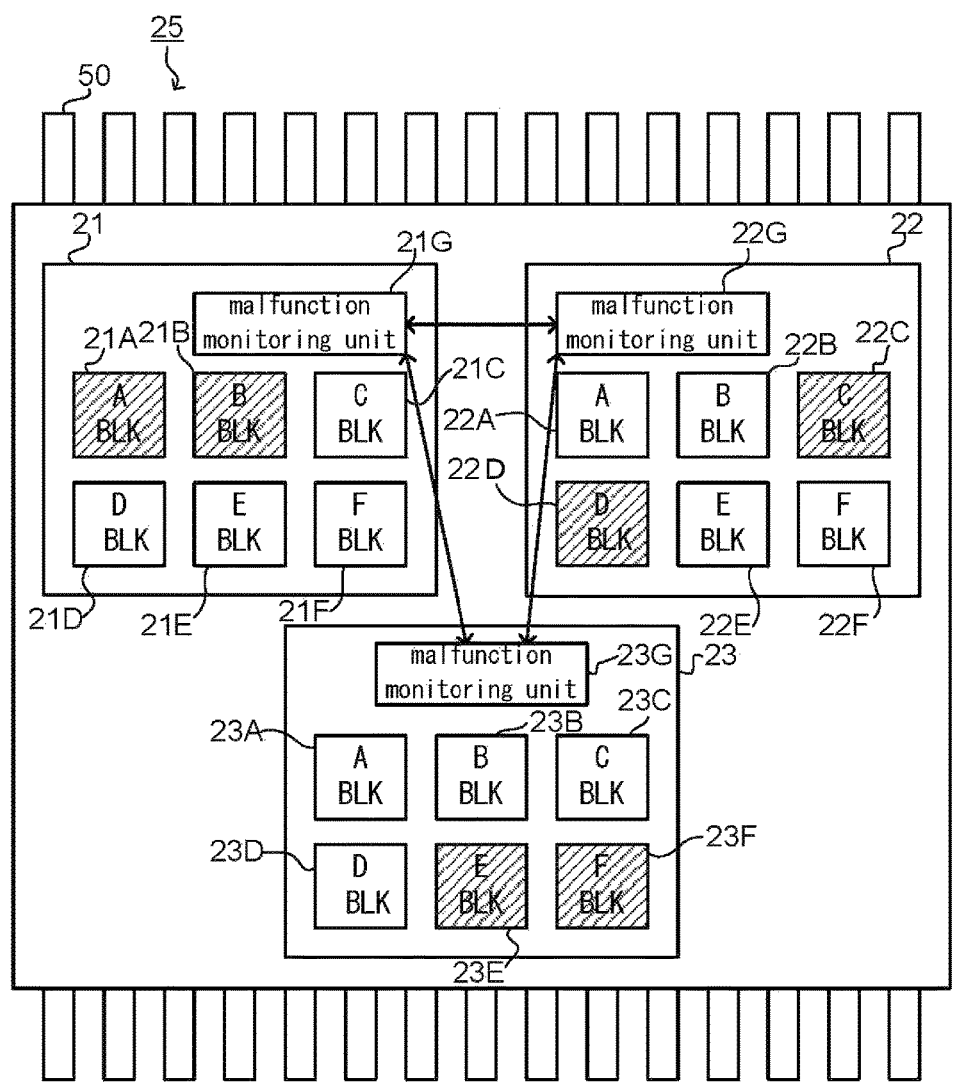
FIG. 7 is a block diagram illustrating a schematic structure of a semiconductor package according to a third embodiment of the present invention.

Next, a third embodiment of the present invention is described. FIG. 7 is a block diagram illustrating a schematic structure of a semiconductor package according to the third embodiment. A semiconductor package 25 illustrated in FIG. 7 includes a first chip 21, a second chip 22, and a third chip 23.

The first chip 21 includes a first A block 21A, a first B block 21B, a first C block 21C, a first D block 21D, a first E block 21E, a first F block 21F, and a malfunction monitoring unit 21G.

The second chip 22 includes a second A block 22A, a second B block 22B, a second C block 22C, a second D block 22D, a second E block 22E, a second F block 22F, and a malfunction monitoring unit 22G.

The third chip 23 includes a third A block 23A, a third B block 23B, a third C block 23C, a third D block 23D, a third E block 23E, a third F block 23F, and a malfunction monitoring unit 23G.

The malfunction monitoring units 21G, 22G, and 23G can communicate with each other.

In this embodiment, in the normal operation, only one of the corresponding functional blocks having the same function among the first chip 21, the second chip 22, and the third chip 23 (e.g. the first A block 21A, the second A block 22A, and the third A block 23A) enables function, and one or more functional blocks enable function in each of the first chip 21, the second chip 22, and the third chip 23. In this way, functional blocks are distributed among three chips, and hence longer life of the semiconductor package 25 is achieved.

For example, in the example of FIG. 7, the first A block 21A and the first B block 21B enable function in the first chip 21, the second C block 22C and the second D block 22D enable function in the second chip 22, and the third E block 23E and the third F block 23F enable function in the third chip 23. In this case, for example, temperatures of the first A block 21A and the first B block 21B are 50 degrees Celsius and 60 degrees Celsius, respectively. Temperatures of the second C block 22C and the second D block 22D are 60 degrees Celsius and 50 degrees Celsius, respectively. Temperatures of the third E block 23E and the third F block 23F are 45 degrees Celsius and 65 degrees Celsius, respectively. Average temperatures of the chips are the same 55 degrees Celsius.

In this embodiment, in the normal operation, the malfunction monitoring units 21G, 22G, and 23G respectively monitor whether or not the functional blocks the enable function in the first chip 21, the second chip 22, and the third chip 23 have a malfunction. Then, if one of the malfunction monitoring units 21G, 22G, and 23G detects a malfunction of the functional block, the malfunction monitoring unit that has detected the malfunction sends notification to the other malfunction monitoring unit. Then, the malfunction monitoring units that receive the notification distribute functional blocks that enable function between the chips to which the malfunction monitoring units belong. In this case, the malfunction monitoring unit that has detected a malfunction disables all functional blocks of the chip to which the malfunction monitoring unit belongs.

In this way, even if one of the chips has a malfunction, the functional blocks are distributed to other normal chips, so that a predetermined function is operated continuously as the semiconductor package 25, and hence longer life of the semiconductor package 25 can be achieved.

Figure 8:
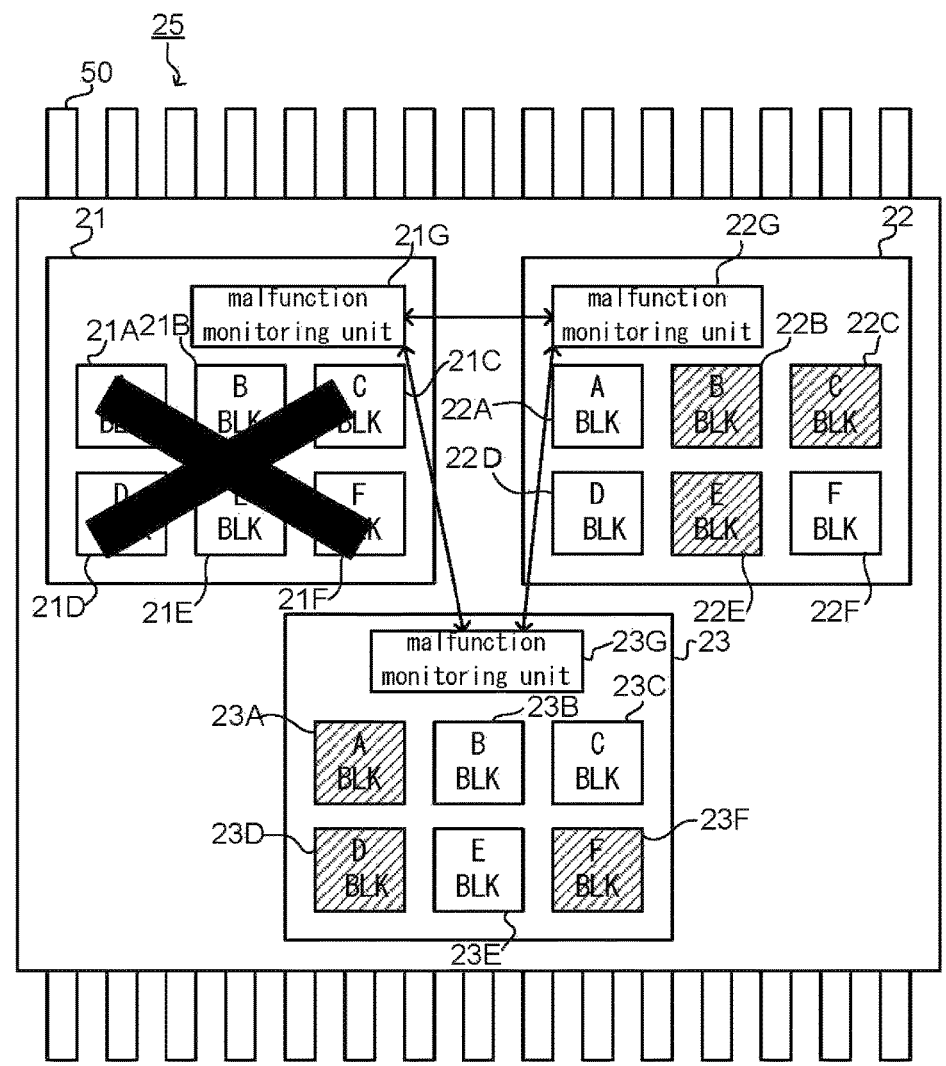
FIG. 8 is a diagram illustrating an example of a case where a malfunction of a chip occurs in the semiconductor package according to the third embodiment of the present invention.

For example, in the example of FIG. 7, if the malfunction monitoring unit 21G detects that one of the first A block 21A and the first B block 21B that enable function has a malfunction in the first chip 21, the malfunction monitoring unit 21G sends notification to the other malfunction monitoring units 22G and 23G. This state is illustrated in FIG. 8. In this way, the malfunction monitoring unit 22G makes the second B block 22B, the second C block 22C, and the second E block 22E enable function in the second chip 22. In this case, the malfunction monitoring unit 23G makes the third A block 23A, the third D block 23D, and the third F block 23F enable function in the third chip 23. In addition, the malfunction monitoring unit 21G disables all functional blocks in the first chip 21.

In this way, the functional blocks are distributed between the second chip 22 and the third chip 23, so that they have the same average temperature at 55 degrees Celsius, and hence longer life of the semiconductor package 25 can be achieved.

Note that in the state of FIG. 8, if the malfunction monitoring unit 22G further detects that one of the functional blocks in the second chip 22 has a malfunction, all functional blocks are disabled in the second chip 22, and the malfunction monitoring unit 22G sends notification to the malfunction monitoring unit 23G, so that all functional blocks are enabled in the third chip 23. In this way, a predetermined function can be operated continuously as the semiconductor package 25.

<Specific Example>

Hereinafter, specific examples of the embodiment described above are described.

«Example of Application to Microcomputer»

Figure 9:
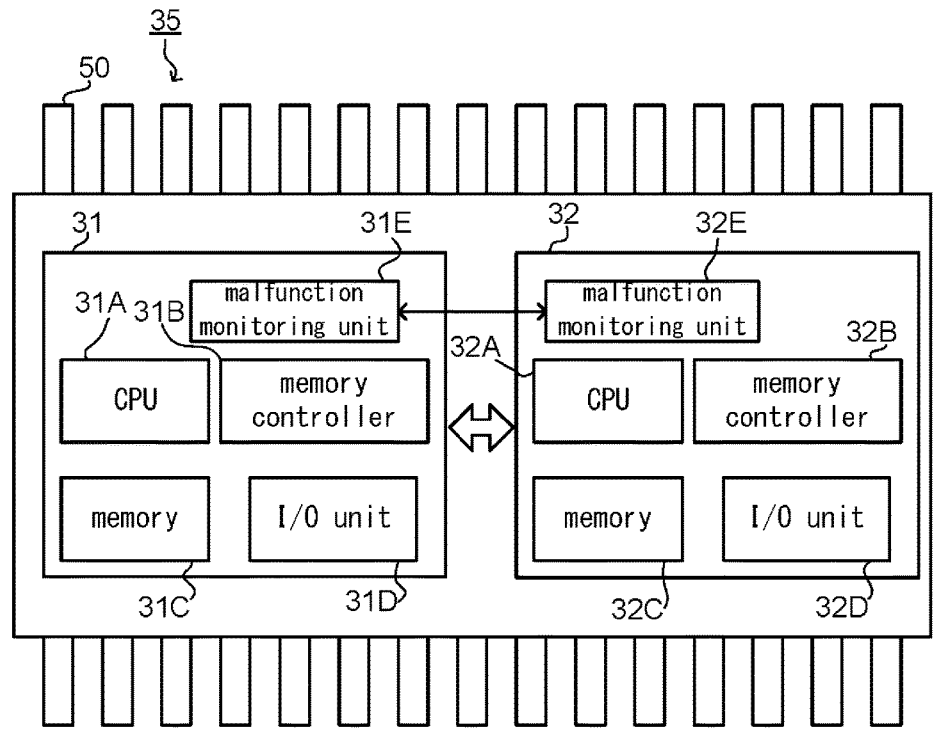
FIG. 9 is a schematic structural diagram illustrating an example of a semiconductor package functioning as a microcomputer.

FIG. 9 is a block diagram illustrating a schematic structure of a semiconductor package as a microcomputer according to an embodiment of the present invention. A semiconductor package 35 illustrated in FIG. 9 corresponds to a specific example of the semiconductor package of the first embodiment (FIG. 1).

The semiconductor package 35 includes a first chip 31 and a second chip 32. The first chip 31 includes a CPU 31A, a memory controller 31B, a memory 31C, an I/O unit 31D, and a malfunction monitoring unit 31E. The second chip 32 includes a CPU 32A, a memory controller 32B, a memory 32C, an I/O unit 32D, and a malfunction monitoring unit 32E.

The CPU is a computing device including a program counter, an instruction decoder, an ALU, and the like. The memory controller is a device relaying between the CPU and the memory, and reads and writes data from and to the memory. The memory stores programs and data, and includes a RAM and a ROM. The I/O unit is an interface relaying between the CPU and an input/output device.

The CPU 31A, the memory controller 31B, the memory 31C, and the I/O unit 31D correspond to functional blocks of the first A block 1A, the first B block 1B, the first C block 1C, and the first D block 1D, respectively in the first embodiment.

The CPU 32A, the memory controller 32B, the memory 32C, and the I/O unit 32D correspond to functional blocks of the second A block 2A, the second B block 2B, the second C block 2C, and the second D block 2D, respectively in the first embodiment.

Therefore, in the same manner as the first embodiment, functional blocks that enable function are distributed between the first chip 31 and the second chip 32. For example, the CPU 31A and the memory controller 31B enable function in the first chip 31, while the memory 32C and the I/O unit 32D enable function in the second chip 32. In this way, the semiconductor package 35 functions as the microcomputer while generated heat is distributed, and hence longer life of the semiconductor package 35 can be achieved.

Note that when functional blocks such as the memory controller and the memory, or the CPU and the I/O unit, which need to communicate with each other, are distributed between the first chip 31 and the second chip 32, communication between the functional block is performed via communication between the chips.

Note that not only the first embodiment but also the second embodiment (provided with the temperature detecting unit) or the third embodiment (three chips) can be applied to the semiconductor package as the microcomputer, and the actions and effects described in the embodiments can be obtained in the same manner.

«Example of Application to Power Supply Device»

Figure 10:
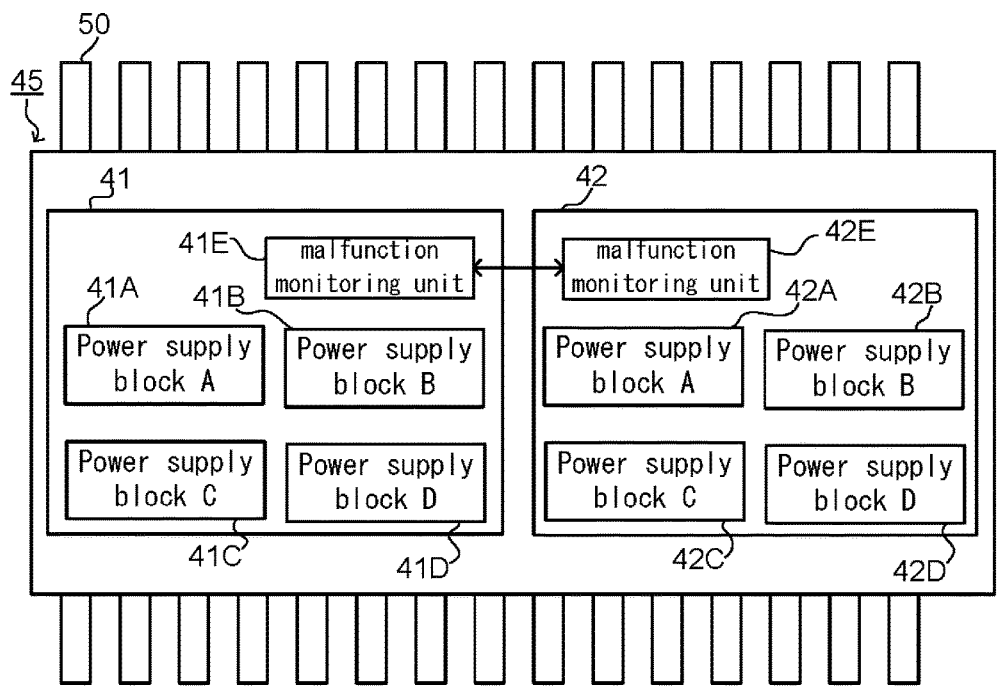
FIG. 10 is a schematic structural diagram illustrating an example of a semiconductor package functioning as a power supply device.

FIG. 10 is a block diagram illustrating a schematic structure of a semiconductor package as a power supply device according to an embodiment of the present invention. A semiconductor package 45 illustrated in FIG. 10 corresponds to a specific example of the semiconductor package of the first embodiment (FIG. 1).

The semiconductor package 45 illustrated in FIG. 10 includes a first chip 41 and a second chip 42. The first chip 41 includes a power supply block A 41A, a power supply block B 41B, a power supply block C 41C, a power supply block D 41D, and a malfunction monitoring unit 41E. The second chip 42 includes a power supply block A 42A, a power supply block B 42B, a power supply block C 42C, a power supply block D 42D, and a malfunction monitoring unit 42E.

Each of the power supply blocks 41A to 41D and the power supply blocks 42A to 42D is constituted of a switching regulator or a series regulator. An output voltage generated from each power supply block is externally output from the corresponding lead frame 50.

The power supply blocks 41A to 41D respectively correspond to the functional blocks of the first A block 1A, the first B block 1B, the first C block 1C, and the first D block 1D in the first embodiment.

The power supply blocks 42A to 42D respectively correspond to the functional blocks of the second A block 2A, the second B block 2B, the second C block 2C, and the second D block 2D in the first embodiment.

The output voltages output from the corresponding power supply blocks having the same function between the chips (e.g. the power supply block A 41A and the power supply block A 42A) may be output from the common lead frame 50.

In the same manner as the first embodiment, the functional blocks that enable function are distributed between the first chip 41 and the second chip 42. For example, the power supply block A 41A and the power supply block B 41B enable function in the first chip 41, while the power supply block C 42C and the power supply block D 42D enable function in the second chip 42. In this way, the semiconductor package 45 functions as the power supply device, and generated heat is distributed so that longer life of the semiconductor package 45 can be achieved.

Note that not only the first embodiment but also the second embodiment (provided with the temperature detecting unit) or the third embodiment (three chips) can be applied to the semiconductor package as the power supply device, and the actions and effects described in the embodiments can be obtained in the same manner.

<Application to a Vehicle>

Figure 11:
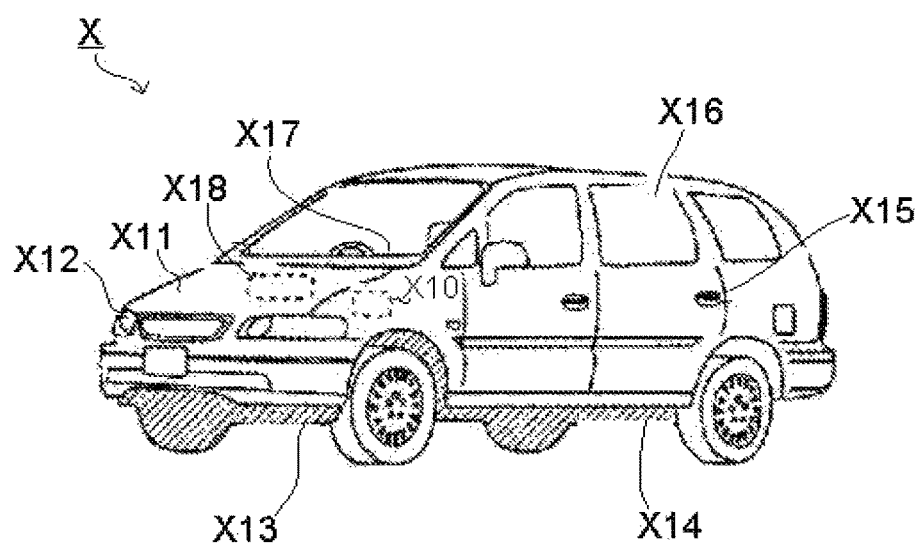
FIG. 11 is an external view illustrating a structural example of a vehicle equipped with various electronic devices.

FIG. 11 is an external view of a structural example of a vehicle equipped with various electronic devices. A vehicle X of this structural example is equipped with a battery X10 and various electronic devices X11 to X18 that work with an input voltage supplied from the battery X10. Note that mounting positions of the battery X10 and the electronic devices X11 to X18 in FIG. 11 may be different from actual positions for convenience sake of illustration.

The electronic device X11 is an engine control unit arranged to perform controls related to the engine (such as injection control, electronic throttle control, idling control, oxygen sensor heater control, and automatic cruise control).

The electronic device X12 is a lamp control unit arranged to perform on-off control of a high intensity discharged (HID) lamp, a daytime running lamp (DRL), and the like.

The electronic device X13 is a transmission control unit arranged to perform control related to a transmission.

The electronic device X14 is a body control unit arranged to perform controls related to movement of the vehicle X (such as anti-lock brake system (ABS) control, electric power steering (EPS) control, and electronic suspension control).

The electronic device X15 is a security control unit arranged to perform control for driving a door lock, an anti-theft security alarm, and the like.

The electronic device X16 is an electronic device such as a wiper, an electric door mirror, a power window, a damper (shock absorber), an electric sunroof, or an electric seat, which is mounted in the vehicle X at the shipping stage as standard equipment or a factory-installed option.

The electronic device X17 is an electronic device such as an in-vehicle audio/visual (A/V) device, a car navigation system, or an electronic toll collection (ETC) system, which is mounted in the vehicle X as a user option.

The electronic device X18 is an electronic device such as an in-vehicle blower, an oil pump, a water pump, or a battery cooling fan, which includes a high-voltage motor.

Note that the semiconductor package according to the embodiments described above can be incorporated in any of the electronic devices X11 to X18 as a microcomputer or a power supply device, for example. In particular, in the recent situation where 1SO26262 or the like for in-vehicle devices is laid down, the technique of the embodiments described above is important for longer life and continuous operation even if a chip is broken down.

<Fourth Embodiment>

Figure 12:
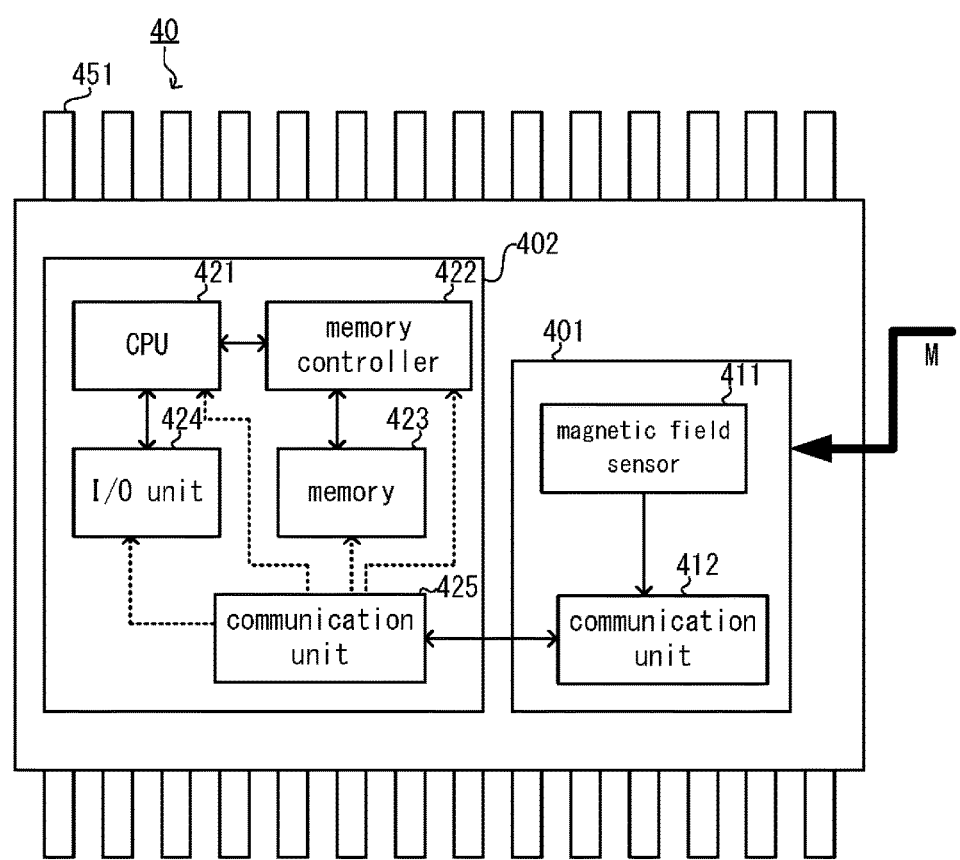
FIG. 12 is a block diagram illustrating a schematic structure of a semiconductor package according to a fourth embodiment of the present invention.

FIG. 12 is a block diagram illustrating a schematic structure of a semiconductor package according to a fourth embodiment of the present invention. A semiconductor package 40 according to the fourth embodiment illustrated in FIG. 12 includes two chips (IC chips), i.e. a first chip 401 and a second chip 402, and is constituted of a multichip semiconductor package. The semiconductor package 40 functions as a microcomputer.

The semiconductor package 40 has various lead frames 451. The first chip 401 and the second chip 402 are fixed to the lead frames 451. Electrodes of the first chip 401 and the second chip 402 are connected to the lead frames 451 with not-shown bonding wires (such as Au wires). The first chip 401, the second chip 402, and the lead frames 451 are sealed with resin. The lead frames 451 are connected to wirings of a not-shown printed circuit board so that the semiconductor package 40 is mounted on the printed circuit board. In this way, the first chip 401 and the second chip 402 can communicate electrical signals and powers with the printed circuit board.

The first chip 401 include a magnetic field sensor 411 and a communication unit 412, which are integrated. The magnetic field sensor 411 (magnetic field detecting unit) is a sensor that detects a magnetic field M generated outside of the semiconductor package 40 and is constituted of a Hall element, for example. When the magnetic field sensor 411 detects the magnetic field M, the communication unit 412 sends notification to a communication unit 425 of the second chip 402.

The second chip 402 includes a CPU 421, a memory controller 422, a memory 423, an I/O unit 424, and the communication unit 425, which are integrated. The functional blocks of the CPU 421, the memory controller 422, the memory 423, and the I/O unit 424 realize functions as the microcomputer.

The CPU 421 is a computing device including a program counter, an instruction decoder, an ALU, and the like. The memory controller 422 is a device relaying between the CPU 421 and the memory 423, and reads and writes data from and to the memory 423. The memory 423 stores programs and data, and includes a RAM, a ROM, and a nonvolatile memory. The I/O unit 424 is an interface relaying between the CPU 421 and an input/output device.

When the communication unit 425 receives from the communication unit 412 the notification indicating that the magnetic field sensor 411 has detected the magnetic field M, it protects at least one of functional blocks of the CPU 421, the memory controller 422, the memory 423, and the I/O unit 424. In other words, the communication unit 425 functions as a protection unit, too.

For example, the communication unit 425 may stop operation of at least the CPU 421 among the CPU 421, the memory controller 422, and the I/O unit 424. In this way, it is possible to prevent the CPU 421 from having a malfunction by influence of the magnetic field M so that a malfunction occurs in the semiconductor package 40 as the microcomputer.

In addition, for example, the communication unit 425 may protect the memory 423 so as to prevent data stored in the memory 423 from being accidentally rewritten by influence of the magnetic field M. In this way, it is possible to prevent the semiconductor package 40 as the microcomputer from having a malfunction.

In addition, for example, the communication unit 425 may switch to a mode in which drive current of at least one of the CPU 421, the memory controller 422, and the I/O unit 424 is increased to operate the same. In this way, it is possible to protect the functional block that is apt to have a malfunction by influence of the magnetic field M when the drive current is small. Therefore, it is possible to continue stable operation of the semiconductor package 40 as the microcomputer.

In addition, when the communication unit 425 receives the notification indicating that the magnetic field sensor 411 has detected the magnetic field M from the communication unit 412, it may make the memory controller 422 control the memory 423 to store information indicating that the magnetic field is generated. For example, by storing the information as current time information, it can be used for analyzing causes of malfunction.

Note that it is not always necessary to divide the structural elements of the semiconductor package 40 into two, i.e. the first chip 401 and the second chip 402, but all structural elements may be constituted in one chip.

<Fifth Embodiment>

Figure 13:
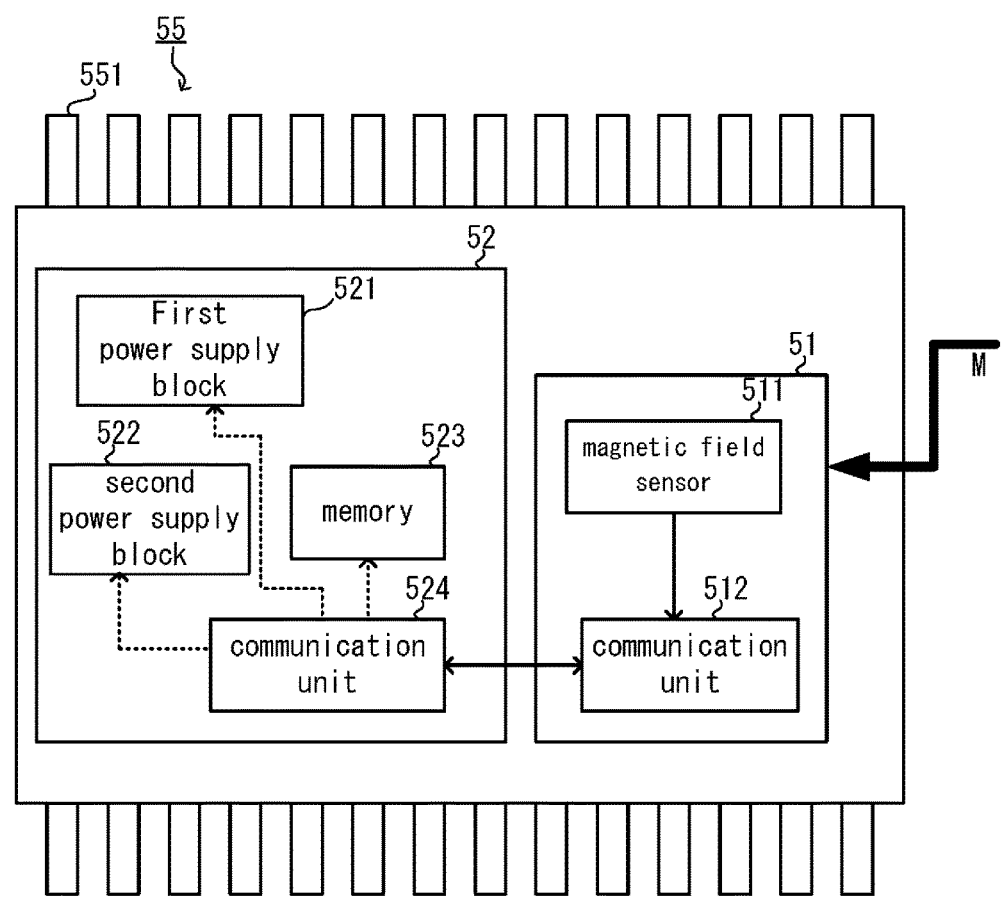
FIG. 13 is a block diagram illustrating a schematic structure of a semiconductor package according to a fifth embodiment of the present invention.

FIG. 13 is a block diagram illustrating a schematic structure of a semiconductor package according to a fifth embodiment of the present invention. A semiconductor package 55 of the fifth embodiment illustrated in FIG. 13 includes two chips (IC chips), i.e. a first chip 51 and a second chip 52, and is constituted of a multichip semiconductor package. The semiconductor package 55 functions as a power supply device.

The semiconductor package 55 has various lead frames 551. Structures of the first chip 51, the second chip 52, and the lead frame 551, and a structure of mounting the semiconductor package 55 are the same as those of the first embodiment described above, and hence detailed description thereof is omitted.

The first chip 51 includes a magnetic field sensor 511 and a communication unit 512, which are integrated. The magnetic field sensor 511 is a sensor that detects the magnetic field M generated outside of the semiconductor package 55 and is constituted of a Hall element, for example. When the magnetic field sensor 511 detects the magnetic field M, the communication unit 512 sends notification to a communication unit 524 of the second chip 52.

The second chip 52 includes a first power supply block 521, a second power supply block 522, a memory 523, and a communication unit 524, which are integrated. The functional blocks of the first power supply block 521 and the second power supply block 522 realize functions as the power supply device. Note that the number of the power supply blocks may be one or more and is not limited.

The first power supply block 521 and the second power supply block 522 are circuits that generate output voltages based on a voltage supplied from outside via the lead frame 551, and are constituted of a switching regulator, a series regulator, or the like, for example. The memory 523 is constituted of a nonvolatile memory such as a flash memory.

When the communication unit 524 receives the notification indicating that the magnetic field sensor 511 has detected the magnetic field M from the communication unit 512, it stops operation of at least one of the first power supply block 521 and the second power supply block 522 so as to protect them. In this way, it is possible to prevent a load of the first power supply block 521 or the second power supply block 522 from having a malfunction by influence of the magnetic field M.

In addition, when the communication unit 524 receives the notification indicating that the magnetic field sensor 511 has detected the magnetic field M from the communication unit 512, it may make the memory 523 store information indicating that the magnetic field is generated. The information is stored as current time information, for example, and can be used for analyzing causes of malfunction.

Note that it is not always necessary to divide the structural elements of the semiconductor package 55 into two, i.e. the first chip 51 and the second chip 52, in the same manner as the fourth embodiment.

<Example of Application to Vehicle>

Next, an example of mounting the semiconductor package according to the embodiment described above in a vehicle is described.

Figure 14:
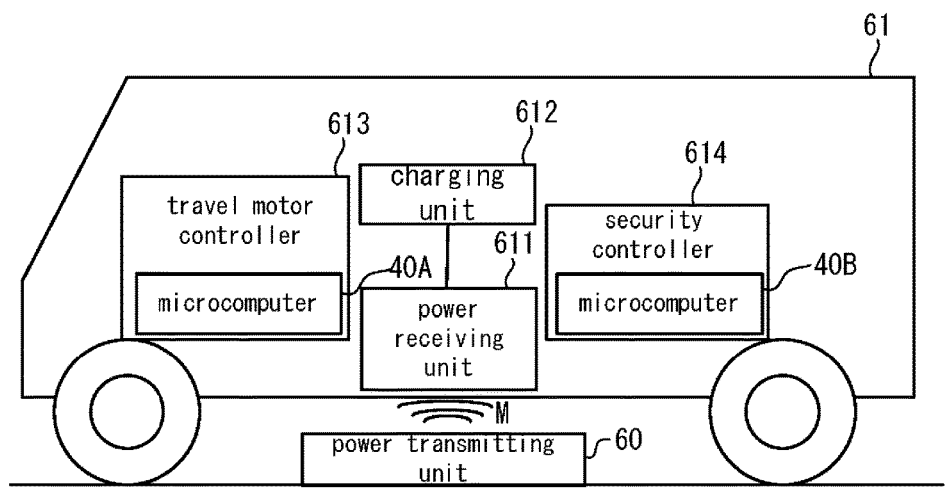
FIG. 14 is a schematic structural diagram illustrating an example where the semiconductor package according to the fourth embodiment of the present invention is mounted in a vehicle.

FIG. 14 is a schematic structural diagram illustrating an example of a case where the semiconductor package 40 according to the fourth embodiment (i.e. the microcomputer) is mounted in a vehicle. A vehicle 61 illustrated in FIG. 14 includes a power receiving unit 611, a charging unit 612, a travel motor controller 613, and a security controller 614.

The vehicle 61 corresponds to a noncontact power supply system. The power receiving unit 611 receives power supplied from a power transmitting unit 60 installed on the ground side in a noncontact manner. An electromagnetic induction method or a magnetic field resonance method can be adopted for the noncontact power supply. Note that locations of the power receiving unit 611 and the power transmitting unit 60 are not limited to those illustrated in FIG. 14.

In the case of the electromagnetic induction method, an AC current is supplied to a power transmission coil included in the power transmitting unit 60 to generate a magnetic field M, so that current is induced in a power receiving coil included in the power receiving unit 611. In the case of the magnetic field resonance method, an LC circuit of a coil and a capacitor is disposed in each of the power transmitting unit 60 and the power receiving unit 611, and LC resonance of the magnetic field M is utilized to transmit power. In each method, the magnetic field M is generated when supplying power.

The charging unit 612 includes a charge control unit, a battery, and the like, which are not-shown, and charges the battery with power received by the power receiving unit 611. The power stored in the battery is supplied to various electronic devices such as the travel motor controller 613 and the security controller 614, and is also supplied to a travel motor (not shown).

The travel motor controller 613 is an electronic device arranged to perform control for driving the travel motor. A microcomputer 40A corresponding to the semiconductor package 40 is included in the travel motor controller 613.

The security controller 614 is an electronic device arranged to perform control for driving a door lock, an anti-theft security alarm, and the like. A microcomputer 45B corresponding to the semiconductor package 45 is included in the security controller 614.

When the power receiving unit 611 receives power supplied from the power transmitting unit 60, the microcomputer 40A detects the generated magnetic field M by the structure of the fourth embodiment described above, and stops operation as the microcomputer, for example. In this way, it is possible to prevent the microcomputer 40A from having a malfunction by influence of the magnetic field M so that a malfunction occurs in control of the travel motor. For example, it is possible to prevent the vehicle 61 during a stop for power supply from accidentally starting to move.

In addition, when the power receiving unit 611 receives power supplied from the power transmitting unit 60, a microcomputer 40B detects the generated magnetic field M by the structure of the fourth embodiment described above, and stops operation as the microcomputer, for example. In this way, it is possible to prevent the microcomputer 40B from having a malfunction by influence of the magnetic field M so that a malfunction occurs in the security control. For example, it is possible to prevent the door lock of the vehicle 61 during a stop for power supply from being unlocked so that a theft may occur.

Note that as described above in the fourth embodiment, when the microcomputer 40A or 40B detects the magnetic field M, if the functional block is operated while increasing the drive current, the microcomputer 40A or 40B can continue the stable operation. Therefore, it is possible to prevent occurrence of a malfunction in the control of the travel motor or in the security control.

Note that it is preferred to position the microcomputer 40A or 40B in a vicinity of the power receiving unit 611, for example, so as to securely detect the magnetic field M when supplying power.

Figure 15:
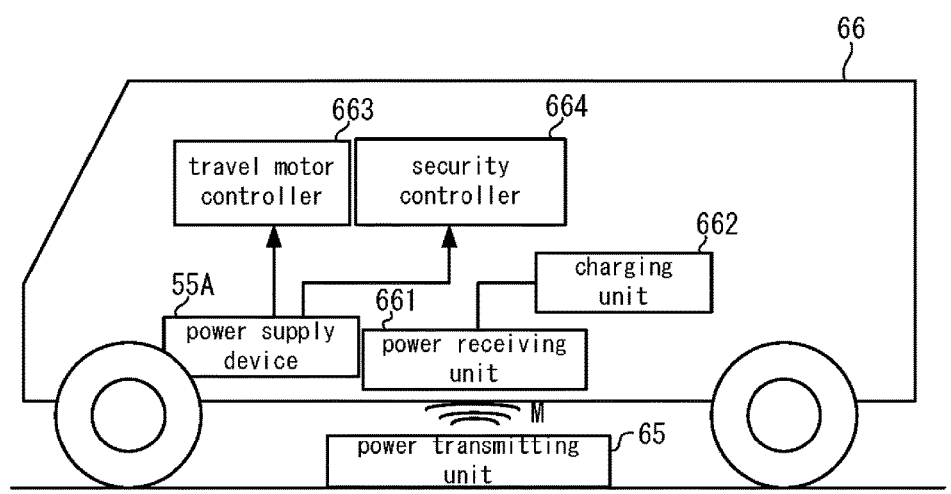
FIG. 15 is a schematic structural diagram illustrating an example where the semiconductor package according to the fifth embodiment of the present invention is mounted in a vehicle.

Next, FIG. 15 is a schematic structural diagram illustrating an example of a case where the semiconductor package 55 according to the fifth embodiment (i.e. the power supply device) is mounted in the vehicle. A vehicle 66 illustrated in FIG. 15 includes a power receiving unit 661, a charging unit 662, a travel motor controller 663, a security controller 664, and a power supply device 55A.

The power supply device 55A corresponds to the semiconductor package 55 according to the fifth embodiment. For example, a load of the first power supply block 521 of the semiconductor package 55 is the travel motor controller 663, and a load of the second power supply block 522 is the security controller 664.

The power receiving unit 661 is supplied with power from a power transmitting unit 65 in a noncontact manner, and the charging unit 662 charges a not-shown battery with the supplied power, in the same manner as the example described above with reference to FIG. 14. The power stored in the battery is supplied to the power supply device 55A and various electronic devices such as the travel motor controller 663 and the security controller 664.

When the power receiving unit 661 receives power supplied from the power transmitting unit 65, the power supply device 55A detects the generated magnetic field M by the structure of the fifth embodiment, and stops operation of the power supply block corresponding to the travel motor controller 663. In this way, it is possible to prevent the travel motor controller 663 as a load from having a malfunction by influence of the magnetic field M so that a malfunction occurs in the control of the travel motor.

In addition, when the power receiving unit 661 receives power supplied from the power transmitting unit 65, the power supply device 55A detects the generated magnetic field M by the structure of the fifth embodiment, and stops operation of the power supply block corresponding to the security controller 664. In this way, it is possible to prevent the security controller 664 as a load from having a malfunction by influence of the magnetic field M so that a malfunction occurs in the security control.

Note that the semiconductor package 40 or 55 according to the fourth or fifth embodiment described above can be appropriately incorporated in any of the electronic devices X11 to X18 mounted in the vehicle X illustrated in FIG. 11, as the microcomputer or the power supply device. In particular, in the recent situation where ISO26262 or the like for in-vehicle devices is laid down, the technique of preventing a malfunction of an electronic device by influence of a magnetic field generated by noncontact power supply or the like is important.

<Example of Application to Portable Device>

Next, an example in which the semiconductor package according to the embodiment described above is mounted in a portable device is described.

Figure 16:
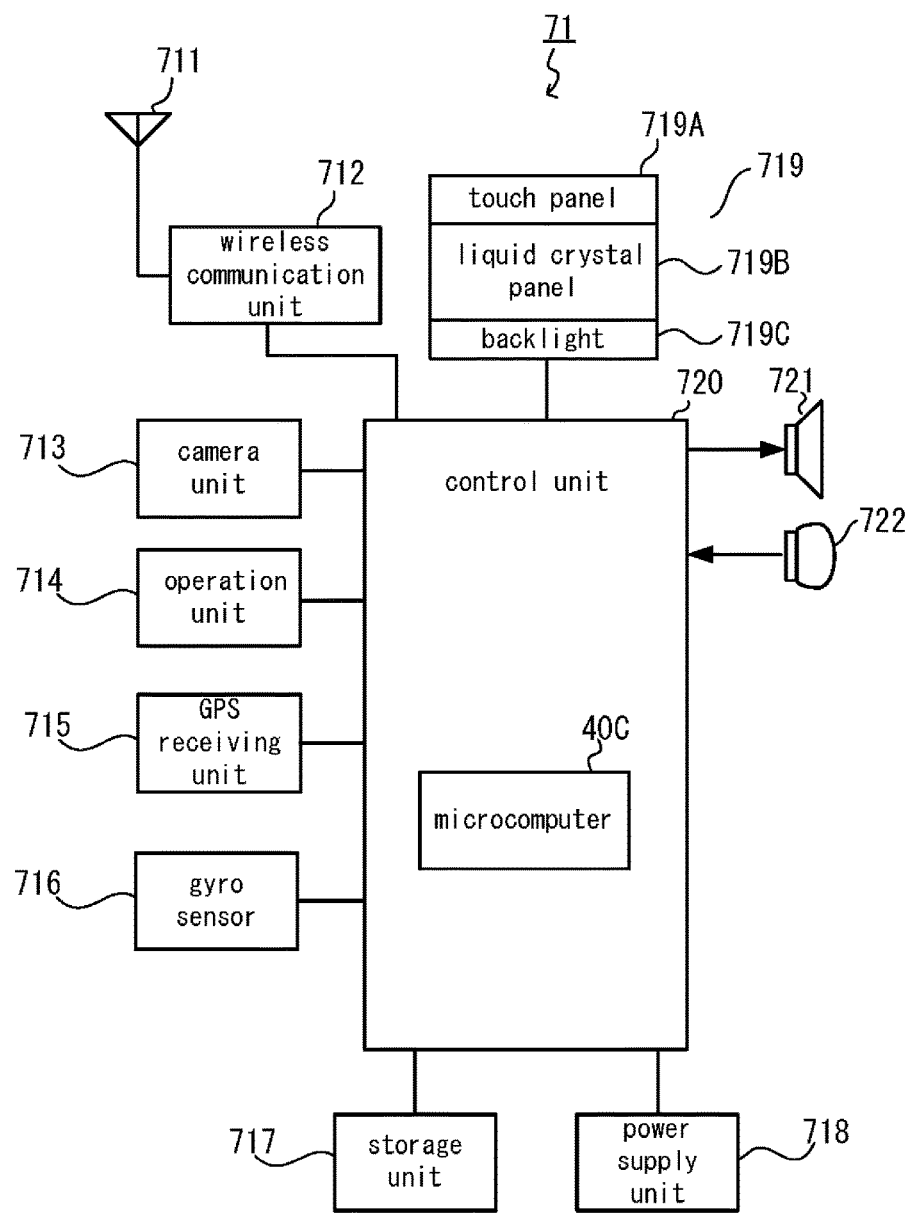
FIG. 16 is a schematic structural diagram illustrating an example of a smart phone equipped with the semiconductor package according to the fourth embodiment of the present invention.

FIG. 16 is a schematic structural diagram illustrating an example of a case where the semiconductor package 40 according to the fourth embodiment (i.e. the microcomputer) is mounted in a smart phone (an example of the portable device). A smart phone 71 illustrated in FIG. 16 includes an antenna 711, a wireless communication unit 712, a camera unit 713, an operation unit 714, a GPS receiving unit 715, a gyro sensor 716, a storage unit 717, a power supply unit 718, a display unit 719, a control unit 720, a speaker 721, and a microphone 722.

The wireless communication unit 712 performs wireless communication with a base station of a mobile communication network. The wireless communication is used to receive and transmit sound data, video data, electronic mail data, and the like, or to receive Web data, streaming data, and the like.

The display unit 719 includes a touch panel 719A, a liquid crystal panel 719B, and a backlight 719C. The liquid crystal panel 719B is driven by the control unit 720, and liquid crystal corresponding to each pixel is driven according to an image to be displayed so that light transmittance is adjusted. The backlight 719C illuminates the liquid crystal panel 719B from backside, and an edge type using an LED and a light guide plate is adopted, for example.

The touch panel 719A is placed on the liquid crystal panel 719B so that images displayed on a display screen of the liquid crystal panel 719B can be seen through it, and detects a touch by a user's finger or other object. The control unit 720 detects a touched position on the touch panel 719A based on a detection signal output from the touch panel 719A.

The camera unit 713 takes an electronic image with an imaging device such as a CMOS image sensor, and the taken image is compressed by JPEG format, for example, and the compressed data can be stored in the storage unit 717.

The operation unit 714 is an interface that receives an input from a user, and is constituted of buttons and the like.

The GPS receiving unit 715 receives electromagnetic waves from GPS satellites and obtains positional information, which is output to the control unit 720. The gyro sensor 716 detects a direction (orientation) of the smart phone 71, and outputs orientation information to the control unit 720.

The storage unit 717 stores address data including names and telephone numbers of communication opponents, transmitted or received electronic mail data, Web data downloaded by Web browsing, and downloaded contents data, and also temporarily stored streaming data and the like. Note that the storage unit 717 is constituted of a flash memory, for example.

The microphone 722 picks up voice of a user, the control unit 720 performs a predetermined process on the picked-up voice, and the wireless communication unit 712 transmits the voice to the base station. In addition, the voice received by the wireless communication unit 712 undergoes a predetermined process by the control unit 720 and is output from the speaker 721. In this way, users can talk over the phone. Note that the speaker 721 can output not only the voice communication sound but also various sounds such as sound based on streaming data received by the wireless communication unit 712.

The power supply unit 718 is a circuit that supplies power stored in a not-shown battery to individual portions of the smart phone 71.

The control unit 720 includes a microcomputer 40C and integrally controls individual portions of the smart phone 71. The microcomputer 40C corresponds to the semiconductor package 40 according to the fourth embodiment.

Figure 17:
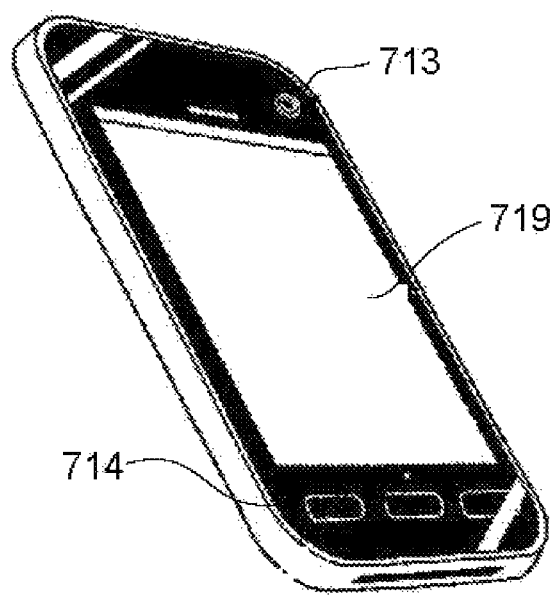
FIG. 17 is a diagram illustrating an example of an external view of the smart phone.

Here, an external view of the smart phone 71 illustrated in FIG. 16 is shown in FIG. 17, for example, in which the camera unit 713, the display unit 719, and the operation unit 714 are disposed on the front side of the smart phone 71.

The smart phone 71 is carried by a user, and hence it is highly possible to position the smart phone 71 in a place where a magnetic field is generated. For example, the smart phone 71 may be positioned in a vicinity of an IH cooker or a microwave oven that generate a magnetic field. In addition, the smart phone 71 may be exposed to a magnetic field when the user is in the vehicle that is being supplied with power in a noncontact manner as described above.

In this case, the microcomputer 40C detects the generated magnetic field by the structure described above in the fourth embodiment and stops operation as the microcomputer, for example. In this way, it is possible to prevent the microcomputer 40C from having a malfunction by influence of the magnetic field so that a malfunction occurs in the smart phone 71.

Note that as described above in the fourth embodiment, when the microcomputer 40C detects the magnetic field and increases drive current for the functional block to operate, the microcomputer 40C can continue its stable operation. Therefore, it is possible to prevent a malfunction from occurring in the smart phone 71.

Figure 18:
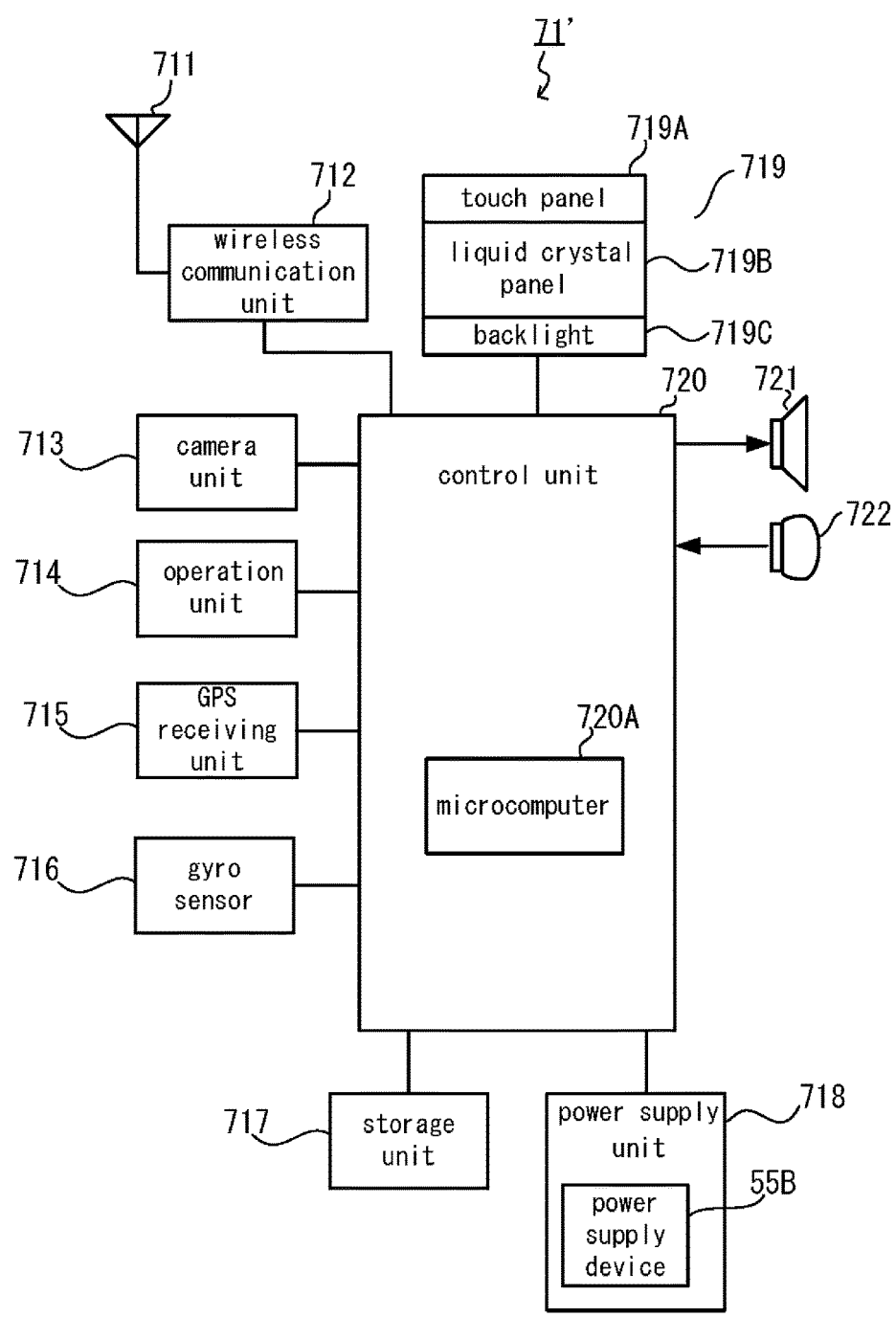
FIG. 18 is a schematic structural diagram illustrating an example of a smart phone equipped with the semiconductor package according to the fifth embodiment of the present invention.

In addition, FIG. 18 is a schematic structural diagram illustrating an example of a case where the semiconductor package 55 according to the fifth embodiment (i.e. the power supply device) is mounted in the smart phone. The structure of a smart phone 71' illustrated in FIG. 18 is basically the same as the structure described above with reference to FIG. 16, and structural differences are that the control unit 720 includes a microcomputer 720A, and that the power supply unit 718 includes a power supply device 55B.

The power supply device 55B corresponds to the semiconductor package 55 according to the fifth embodiment. An output voltage generated by the power supply device 55B is supplied to the microcomputer 720A as a load.

With this structure, when the user carries the smart phone 71' and positions it in a place where a magnetic field is generated, the power supply device 55B detects the magnetic field by the structure described above in the fifth embodiment and stops the power supply block that supplies voltage to the microcomputer 720A (e.g. the first power supply block 521). In this way, it is possible to prevent the microcomputer 720A from having a malfunction by influence of the magnetic field so that a malfunction occurs in the smart phone 71'.

According to the smart phone 71 or 71' described above, restriction of areas in which users can carry it can be relieved without providing a shield member or the like for protecting the microcomputer 40C or 720A from the magnetic field, and hence cost can be reduced.

Note that the semiconductor package of the embodiment described above can be applied not only to the smart phone but also to various portable devices such as a tablet computer.

<Others>

Note that the structure of the present invention is not limited to the embodiments described above and can be variously modified within the scope of the invention without deviating from the spirit thereof. In other words, the embodiments described above are merely examples in every aspect and should not be interpreted as a limitation. The technical scope of the present invention is defined not by the above description of the embodiment but by the claims and should be understood to include all modifications within meanings and scopes equivalent to the claims.

What is claimed is:

1. A semiconductor package comprising a plurality of chips, wherein
    the plurality of chips include a plurality of corresponding functional blocks having the same function among the chips,
    only one of the corresponding functional blocks having the same function among the chips enables function, and one or more functional blocks enable function in each of the chips so that the functional blocks are distributed among the chips,
wherein the chips further include a temperature detecting unit corresponding to each of the functional blocks, and a determination unit arranged to determine the functional block to enable function based on a result of detection by the temperature detecting unit.

2. The semiconductor package according to claim 1, wherein the functional blocks are distributed among the chips while the functional block to enable function is changed.

3. The semiconductor package according to claim 2, wherein the functional block to enable function is changed based on the number of start-up times of the semiconductor package.

4. The semiconductor package according to claim 2, wherein the functional block to enable function is changed in accordance with an operation mode of the semiconductor package.

5. The semiconductor package according to claim 1, wherein the semiconductor package is mountable in a vehicle.

6. A semiconductor package comprising two chips, wherein the chips include a plurality of corresponding functional blocks having the same function among the chips, only one of the corresponding functional blocks having the same function among the chips enables function, and one or more functional blocks enable function in each of the chips so that the functional blocks are distributed among the chips, wherein each of the chips further includes a malfunction monitoring unit arranged to monitor whether or not the functional block has a malfunction, and
wherein when one of the malfunction monitoring units detects a malfunction, all functional blocks of the chip to which the one of the malfunction monitoring units belongs disable function, and the one of the malfunction monitoring units sends notification to the other malfunction monitoring unit so that all functional blocks of the chip to which the other malfunction monitoring unit belongs enable function.

7. The semiconductor package according to claim 6, wherein the functional blocks are distributed among the chips while the functional block to enable function is changed.

8. The semiconductor package according to claim 7, wherein the functional block to enable function is changed based on the number of start-up times of the semiconductor package.

9. The semiconductor package according to claim 7, wherein the functional block to enable function is changed in accordance with an operation mode of the semiconductor package.

10. The semiconductor package according to claim 6, wherein the semiconductor package is mountable in a vehicle.

* * * * *